United States Patent
Wan et al.

(10) Patent No.: US 10,872,807 B2
(45) Date of Patent: Dec. 22, 2020

(54) MANUFACTURING METHOD OF VIA HOLE, DISPLAY SUBSTRATE, AND MANUFACTURING METHOD THEREOF

(71) Applicants: Hefei Xinsheng Optoelectronics Technology Co., Ltd., Hefei (CN); BOE Technology Group Co., Ltd., Beijing (CN)

(72) Inventors: Yunhai Wan, Beijing (CN); Chengshao Yang, Beijing (CN); Wenlong Wang, Beijing (CN); Ke Cao, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/315,406

(22) PCT Filed: Mar. 22, 2018

(86) PCT No.: PCT/CN2018/080001
§ 371 (c)(1),
(2) Date: Jan. 4, 2019

(87) PCT Pub. No.: WO2018/205753
PCT Pub. Date: Nov. 15, 2018

(65) Prior Publication Data
US 2019/0311943 A1  Oct. 10, 2019

(30) Foreign Application Priority Data

May 12, 2017  (CN) .......................... 2017 1 0335236

(51) Int. Cl.
*H01L 21/768*   (2006.01)
*H01L 27/12*    (2006.01)

(52) U.S. Cl.
CPC ...... *H01L 21/76802* (2013.01); *H01L 27/124* (2013.01); *H01L 27/1244* (2013.01); *H01L 27/1259* (2013.01); *H01L 27/1262* (2013.01)

(58) Field of Classification Search
CPC .................... H01L 21/76802; G02F 1/136227
See application file for complete search history.

(56) References Cited

U.S. PATENT DOCUMENTS

| 7,914,354 B2 | 3/2011 | Kang et al. | |
| 2008/0057632 A1* | 3/2008 | Arai ..................... | H01L 27/1288 438/149 |

(Continued)

FOREIGN PATENT DOCUMENTS

| CN | 101127357 A | 2/2008 |
| CN | 105607365 A | 5/2016 |

(Continued)

OTHER PUBLICATIONS

Jun. 22, 2018—(WO) International Search Report and Written Opinion Appn PCT/CN2018/080001.

(Continued)

*Primary Examiner* — Jay C Chang
*Assistant Examiner* — Mikka Liu
(74) *Attorney, Agent, or Firm* — Banner & Witcoff, Ltd.

(57) ABSTRACT

A manufacturing method of a via hole, a display substrate and a manufacturing method thereof are provided. The manufacturing method of a via hole includes: forming a first via hole penetrating the passivation protection layer, the first via hole being defined by a first side wall of the passivation protection layer; forming an organic insulating layer on the passivation protection layer; and forming a second via hole penetrating the organic insulating layer, the second via hole being defined by a second side wall of the organic insulating layer; wherein in a sectional view, a bottom of the second via (Continued)

hole is located in the first via hole and is in direct contact with the conductive layer, and the second side wall of the organic insulating layer is separated from the first side wall of the passivation protection layer.

4 Claims, 8 Drawing Sheets

(56) References Cited

U.S. PATENT DOCUMENTS

| | | | |
|---|---|---|---|
| 2008/0284327 A1* | 11/2008 | Kang | .................. H01L 51/56 |
| | | | 313/504 |
| 2016/0293511 A1 | 10/2016 | Huang et al. | |
| 2018/0052373 A1 | 2/2018 | Zeng | |

FOREIGN PATENT DOCUMENTS

| | | |
|---|---|---|
| CN | 105742292 A | 7/2016 |
| CN | 205427390 U | 8/2016 |
| CN | 106094361 A | 11/2016 |
| CN | 106098614 A | 11/2016 |
| CN | 107068612 A | 8/2017 |

OTHER PUBLICATIONS

Apr. 2, 2019—(CN) First Office Action Appn 201710335236.4 with English Translation.

* cited by examiner

MANUFACTURING METHOD OF VIA HOLE, DISPLAY SUBSTRATE, AND MANUFACTURING METHOD THEREOF

The application is a U.S. National Phase Entry of International Application No. PCT/CN2018/080001 filed on Mar. 22, 2018, designating the United States of America and claiming priority to Chinese patent application No. 201710335236.4 filed on May 12 2017. The present application claims priority to and the benefit of the above-identified applications and the above-identified applications are incorporated by reference herein in their entirety.

TECHNICAL FIELD

Embodiments of the present disclosure relate to a manufacturing method of a via hole, a display substrate and a manufacturing method thereof.

BACKGROUND

Display device is a kind of device configured to display a character, a number, a symbol, a picture or an image formed by combining at least two of a character, a number, a symbol and a picture. The display device generally includes a display substrate, and the display substrate usually includes a plurality of pixel units formed on a base substrate and arranged in an array. Each of the pixel units typically includes a thin film transistor (TFT) and a pixel electrode located at a side of the TFT far away from the base substrate. The pixel electrode is connected to a drain electrode in a source-drain electrode layer of the TFT.

SUMMARY

An embodiment of the present disclosure provides a manufacturing method of a via hole, including: forming a passivation protection layer on a conductive layer; forming a first via hole penetrating the passivation protection layer, wherein the first via hole is defined by a first side wall of the passivation protection layer; forming an organic insulating layer on the passivation protection layer; and forming a second via hole penetrating the organic insulating layer, wherein the second via hole is defined by a second side wall of the organic insulating layer; wherein in a sectional view, a bottom of the second via hole is located in the first via hole and is in direct contact with the conductive layer, and the second side wall of the organic insulating layer is separated from the first side wall of the passivation protection layer.

In an example, a material of the organic insulating layer is a photoresist material.

In an example, forming the second via hole penetrating the organic unsulating layer includes: exposing the organic insulating layer by utilizing a first mask; and developing the organic insulating layer thus exposed, to form the second via hole.

In an example, forming the first via hole penetrating the passivation protection layer includes: coating a photoresist on the passivation protection layer; exposing the photoresist by utilizing a second mask; developing the photoresist thus exposed; etching the passivation protection layer to form the first via hole; and removing the remaining photoresist.

In an example, the first mask and the second mask are a same one mask.

In an example, an amount of light exposure utilized in exposing the organic insulating layer is 80%~90% of an amount of light exposure utilized in exposing the photoresist.

In an example, the conductive layer is a drain electrode of a thin film transistor of a display substrate.

Another embodiment of the present disclosure provides a manufacturing method of a display substrate, including any one of the manufacturing method of the via hole described above.

In an example, the conductive layer is a source-drain electrode layer. Before forming the passivation protection layer on the conductive layer, the manufacturing method of a display substrate further includes: sequentially forming a gate electrode, a gate insulating layer, an active layer and the source-drain electrode layer on a base substrate. After forming the second via hole penetrating the organic insulating layer, the manufacturing method of a display substrate further includes: forming a pixel electrode on the organic insulating layer, the pixel electrode being connected to a drain electrode of the source-drain electrode layer through the second via hole; forming a passivation insulating layer on the pixel electrode; and forming a common electrode on the passivation insulating layer.

Yet another embodiment of the present disclosure provides a display substrate, including a base substrate, and a source-drain electrode layer, a passivation protection layer, an organic insulating layer and a pixel electrode located above the base substrate, the source-drain electrode layer including a drain electrode; wherein the first via hole penetrates the passivation protection layer, and the first via hole is defined by a first side wall of the passivation protection layer; a portion of the organic insulating layer is filled in the first via hole; the second via hole penetrates the organic insulating layer, and the second via hole is defined by a second side wall of the organic insulating layer; wherein in a sectional view, a bottom of the second via hole is located in the first via hole and is in direct contact with the conductive layer, and the second side wall of the organic insulating layer is separated from the first side wall of the passivation protection layer.

In an example, the display substrate further includes: a gate electrode, a gate insulating layer and an active layer located between the base substrate and the source-drain electrode layer and sequentially stacked; and a passivation insulating layer and a common electrode located on the pixel electrode and sequentially stacked.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Hereinafter, more details will be given with reference to the drawings accompanying the description, so as to further explain the manufacturing method of a via hole, the manufacturing method of a display substrate and the display substrate provided by the embodiments of the present disclosure.

In a display substrate, an insulating layer usually is disposed between a pixel electrode and a source-drain electrode layer. The pixel electrode is generally connected to a drain electrode of the source-drain electrode layer through a via hole disposed in the insulating layer. However, in an existing display substrate, the insulating layer usually includes a passivation protection layer and an organic insulating layer sequentially stacked on the source-drain electrode layer. As a result, a side wall of the via hole in the insulating layer includes a potion corresponding to the passivation protection layer and a portion corresponding to the organic insulating layer. When the pixel electrode is formed on the organic insulating layer and is connected to the drain electrode through the via hole in the insulating layer, disconnection may be usually occurred at the side wall of the via hole corresponding to an interface of the passivation protection layer and the organic insulating layer, which results in a poor connection between the pixel electrode and the drain electrode and hence leads to the degradation of an image display quality of the display device, for example, leading to a dark line occurred on in display device.

Figure 1:
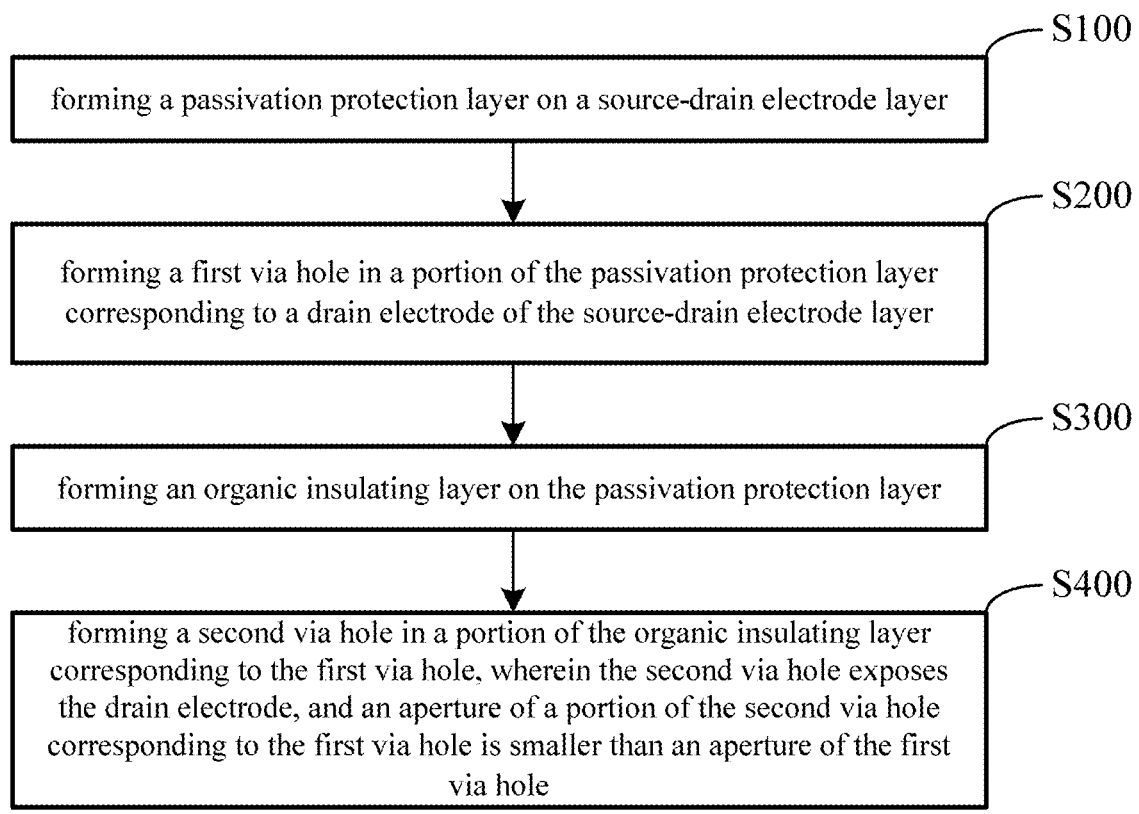
FIG. 1 is a flow chart illustrating a manufacturing method of a via hole provided by an embodiment of the present disclosure.

Referring to FIG. 1, the manufacturing method of a via hole provided by the embodiment of the present disclosure includes:

Step S100, forming a passivation protection layer on a source-drain electrode layer;

Step S200, forming a first via hole in a portion of the passivation protection layer corresponding to a drain electrode of the source-drain electrode layer;

Step S300, forming an organic insulating layer on the passivation protection layer; and Step S400, forming a second via hole in a portion of the organic insulating layer corresponding to the first via hole; the second via hole exposing the drain electrode, and an aperture of a portion of the second via hole corresponding to the first via hole is smaller than an aperture of the first via hole.

Figure 3:
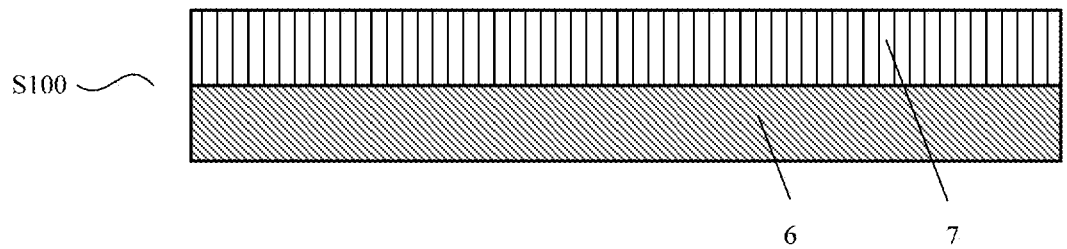
FIGS. 3-11 are structurally sectional views illustrating different stages during a manufacturing process of a via hole provided by an embodiment of the present disclosure.
Figure 9:
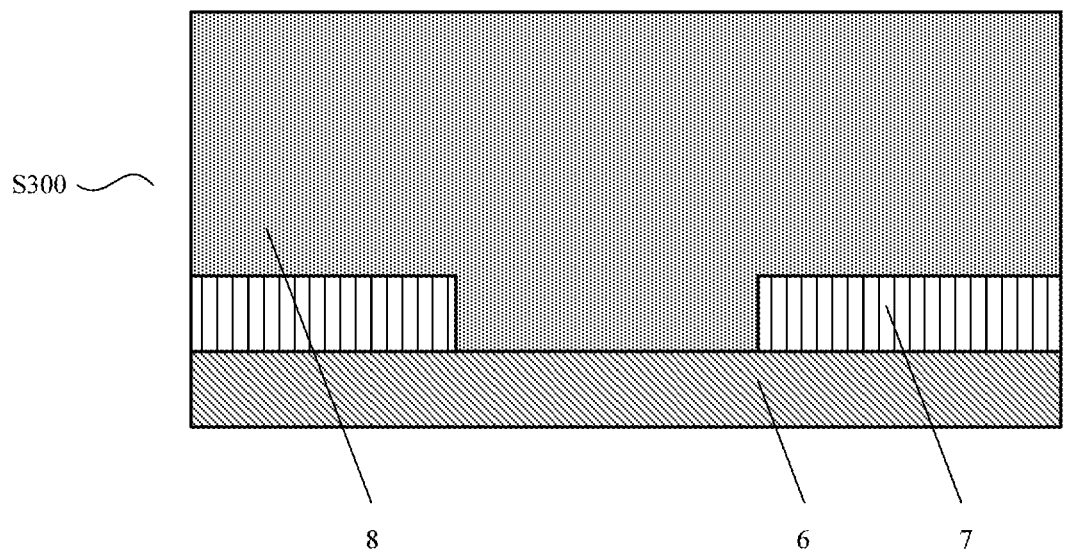
Figure 10:
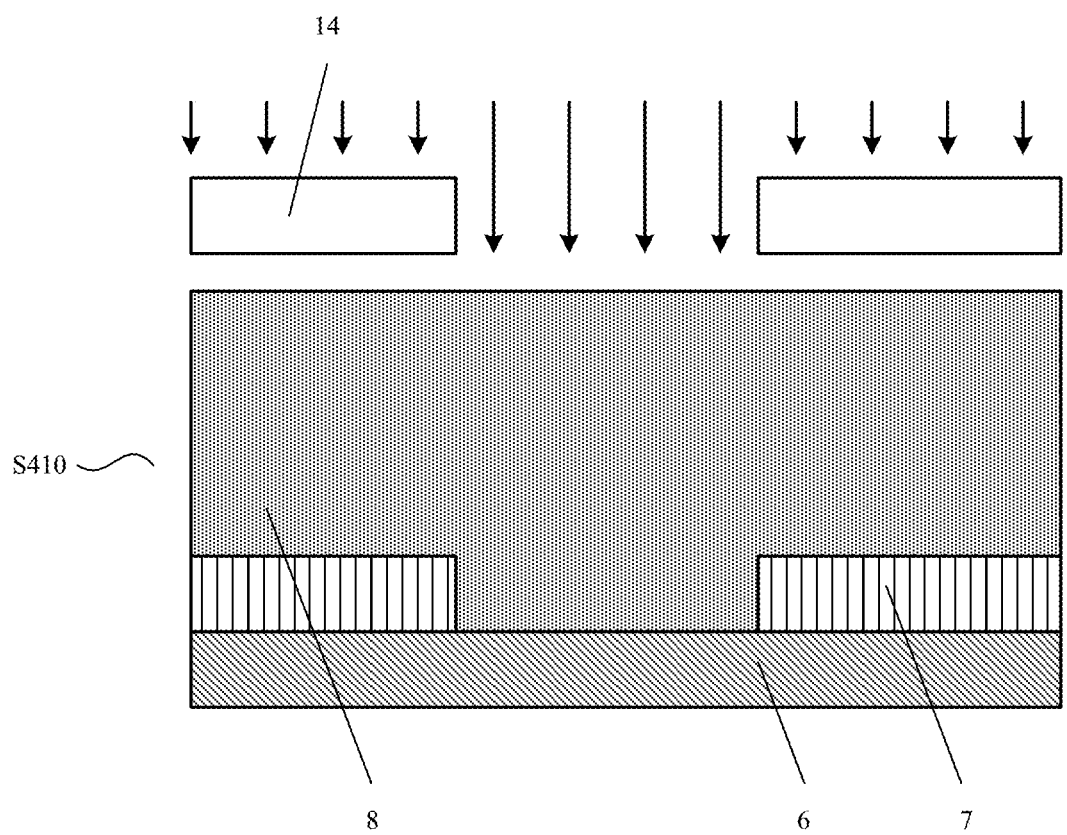
Figure 11:
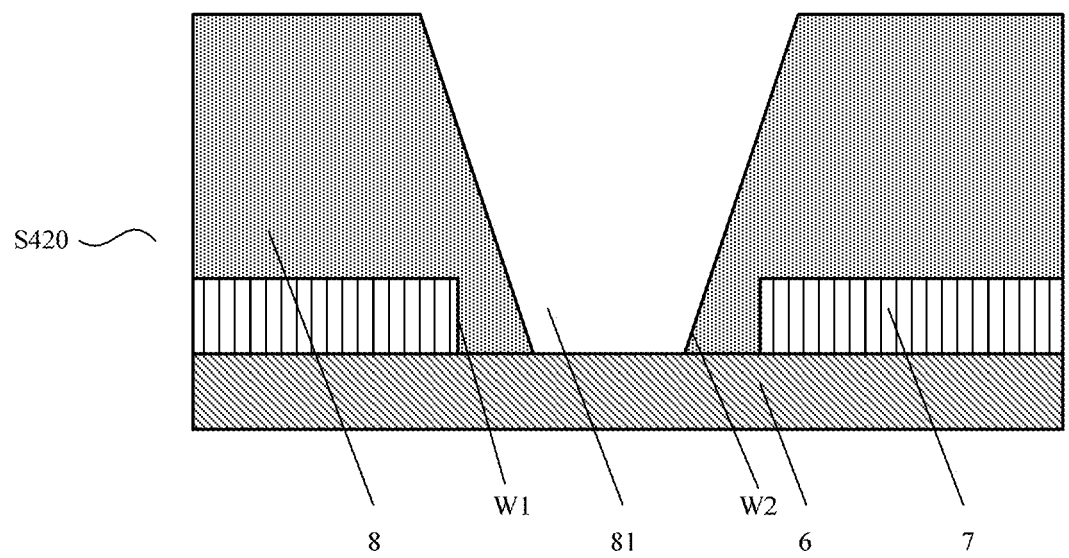

Referring to FIG. 1 and FIGS. 3-11, during manufacturing the via hole connecting the pixel electrode to the drain electrode by using the manufacturing method of the via hole provided by the embodiment of the present disclosure, as illustrated in FIG. 3, firstly, forming a passivation protection layer 7 on a source-drain electrode layer; the passivation protection layer 7 herein, for example, is an inorganic material layer such as a metallic oxide layer; subsequently, referring to FIGS. 4-8, forming a a via hole 71 in a portion of the passivation protection layer 7 corresponding to a drain electrode 6 of the source-drain electrode layer, the first via hole 71 exposing the drain electrode 6; subsequently, referring to FIG. 9, forming an organic insulating layer 8 on the passivation protection layer 7, the organic insulating layer 8 covers the passivation protection layer 7 and covers the drain electrode 6 exposed by the first via hole 71; subsequently, referring to FIG. 10 and FIG. 11, forming a second via hole 81 in a portion of the organic insulating layer 8 corresponding to the first via hole 71. The second via hole 81 exposes the drain electrode 6. An aperture of a portion of the second via hole 81 corresponding to the first via hole 71 is smaller than an aperture of the first via hole 71. The first via 71 is sleeved outside the second via 81. A gap between a side wall of the first via hole 71 and a side wall of the second via hole 81 is filled with the organic insulating layer 8. The entire side wall of the second via hole 81 is corresponding to the organic insulating layer 8 and no portion of the side wall of the second via hole 81 is corresponding to the passivation protection layer 7. As compared with the related art in which the side wall of the via hole in the insulating layer includes a portion corresponding to the passivation protection layer and a portion corresponding to the organic insulating layer, referring to FIG. 13, by forming the pixel electrode 9 on the organic insulting layer 8 and connecting the pixel electrode 9 to the drain electrode 6 through the second via hole 81, disconnection of the pixel electrode 9 would not happen, so that the pixel electrode 9 can be well connected to the drain electrode 6, thereby improving the image display quality of the display device.

Herein, the first via hole 71 penetrates the passivation protection layer 7, and the entire first via hole 71 is defined by a first side wall W1 of the passivation protection layer; a portion of the organic insulating layer 8 is filled into the first via hole 71; the second via hole 81 penetrates the organic insulating layer 8, and the entire second via hole 81 is defined by a second side wall W2 of the organic insulating layer. In the sectional views illustrated in FIGS. 11 and 13, a bottom of the second via hole 81 is located in the first via hole 71 and is in direct contact with the drain electrode 6. The second side wall W2 of the organic insulating layer 8 is separated from the first side wall W1 of the passivation protection layer 7.

In a plan view, both of the first via hole and the second via hole have a closed shape, for example, a circle shape.

Moreover, in the manufacturing method of the via hole as provided by the embodiment of the present disclosure, the via hole is manufactured with a simpler and more easily performed method without adopting special step(s), which is applicable for large-scale mass production.

In the embodiments above, a material of the organic insulating layer can be selected according to actual demands. For example, a material having good dielectric property can be selected as the material of the organic insulating layer. For example, the material of the organic insulating layer can be as same as that of a photoresist. For example, a material of negative photoresist can be selected as the material of the organic insulating layer.

Figure 2:
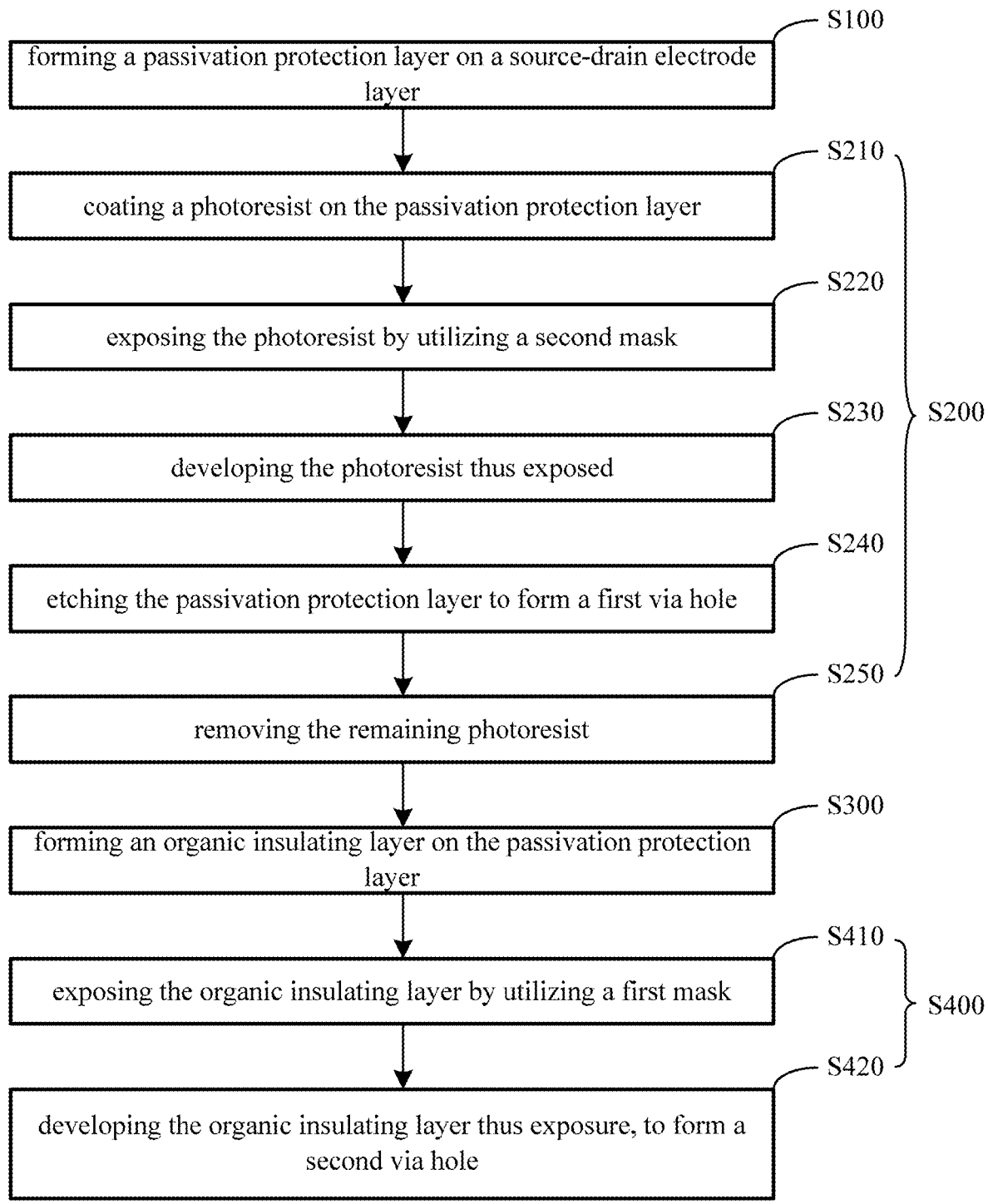
FIG. 2 is a flow chart illustrating a manufacturing method of a via hole provided by an embodiment of the present disclosure.

When the material of the organic insulating layer is as same as the material of photoresist, the organic insulating layer itself can be used as the photoresist. When forming the second via hole, as illustrated in FIG. 2, the step S400 can include:

Step S410, exposing the organic insulating layer by utilizing a first mask; and

Step S420, developing the organic insulating layer thus exposed, to form the second via hole.

For example, during forming the second via hole in the portion of the organic insulating layer corresponding to the first via hole, after forming the organic insulating layer, referring to FIG. 10, first of all, exposing the organic insulating layer 8 by utilizing a first mask 14; subsequently, referring to the FIG. 11, developing the organic insulating layer 8 thus exposed to form the second via hole 81. In the embodiment of the present disclosure, when forming the second via hole, a photoresist is not needed to be coated on the organic insulating layer after forming the organic insulating layer on the passivation protection layer; the organic insulating layer can be directly exposed by utilizing the first mask and the second via hole is formed by developing the organic insulating layer thus exposed, thus eliminating steps such as coating another photoresist, etching the organic insulating layer and removing the another photoresist unexposed. Therefore, the second via hole is formed by simple steps, which shortens the time required by forming the second via hole, improves the efficiency of forming the second via hole and reduces the cost of forming the second via hole.

Still referring to FIG. 2, in the embodiment of the present disclosure, the step S200 of forming a via hole in a portion of the passivation protection layer corresponding to a drain electrode of the source-drain electrode layer can include:

Step S210, coating a photoresist on the passivation protection layer;

Step S220, exposing the photoresist by utilizing a second mask;

Step S230, developing the photoresist thus exposed;

Step S240, etching the passivation protection layer to form the first via hole; and Step S250, removing the remaining photoresist.

Figure 4:
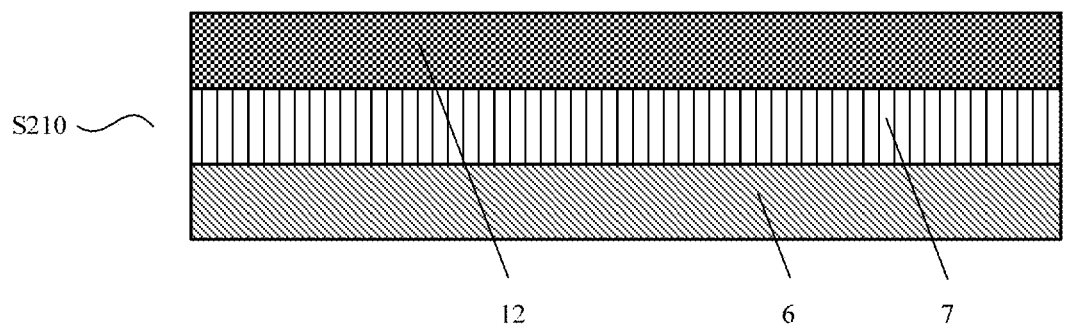
Figure 5:
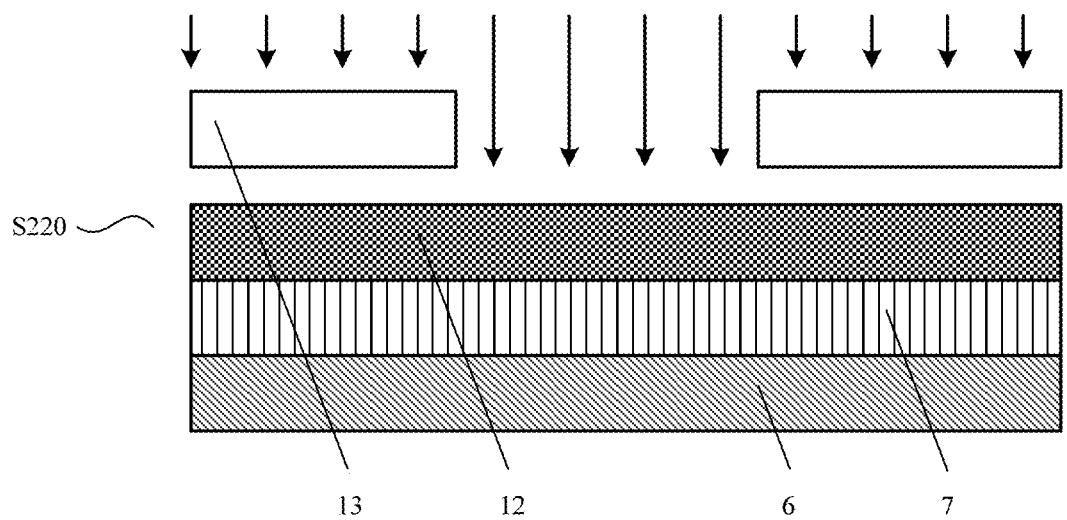
Figure 6:
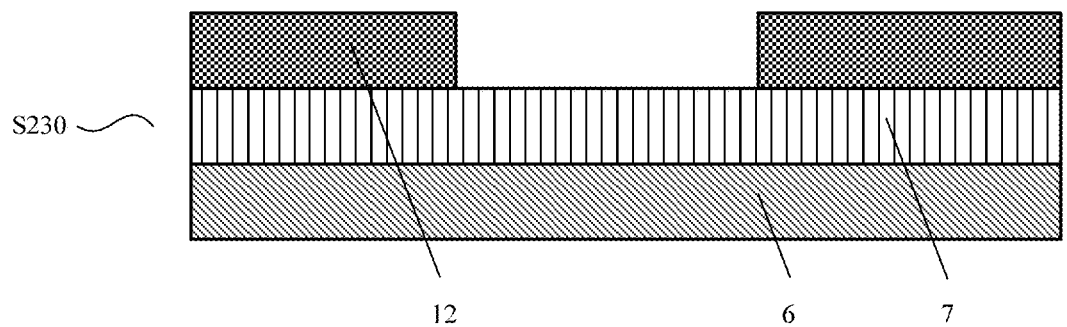
Figure 7:
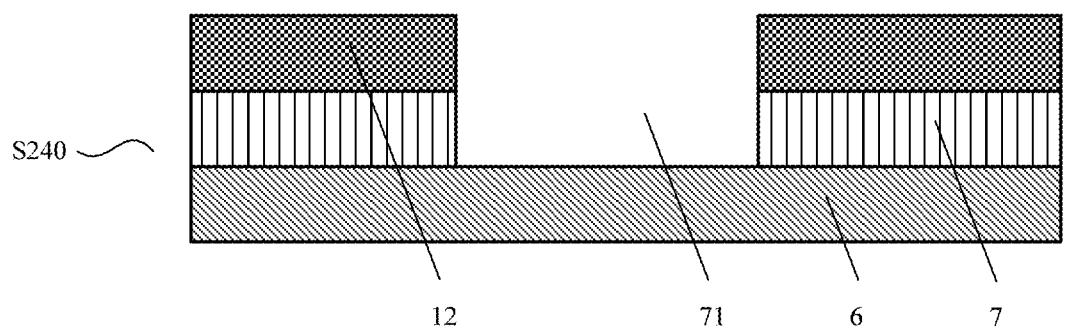
Figure 8:
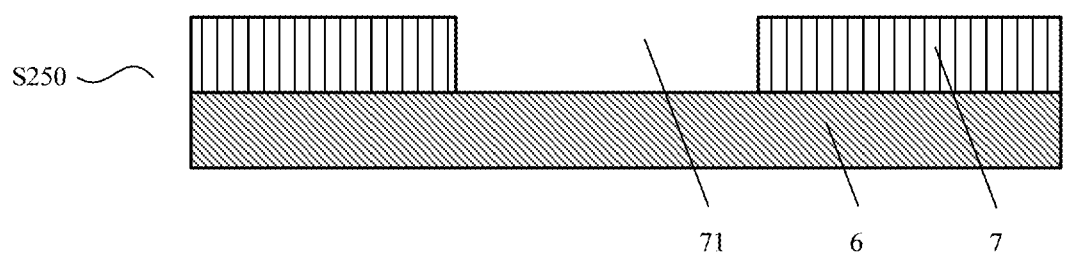

For example, after forming the passivation protection layer on the source-drain electrode layer, referring to FIG. 4, coating a photoresist 12 on the passivation protection layer 7; A material of the photoresist 12 can be as same as that of the organic insulating layer 8; subsequently, referring to FIG. 5, exposing the photoresist 12 by utilizing a second mask 12; subsequently, referring to FIG. 6, developing the photoresist 12 thus exposed; after developing, an area of the passivation protection layer 7 in which the first via hole is to be formed is exposed; subsequently, referring to FIG. 7, etching the passivation protection layer 7, that is, etching off the exposed portion of the passivation protection layer 7 to form the first via hole 71; subsequently, referring to FIG. 8, removing the photoresist 12 remaining on the passivation protection layer 7.

In the embodiment of the present disclosure, the material of the organic insulating layer can be different from that of the photoresist used in forming the first via hole. For example, the material of the organic insulating layer is a material of negative photoresist, while the material of the photoresist used in forming the first via hole is a material of positive photoresist; or, the material of the organic insulating layer is a material of positive photoresist, while the material of the photoresist used in forming the first via hole is a material of negative photoresist. In such case, the second mask used in forming the first via hole is different from the first mask used in forming the second via hole.

In the embodiment of the present disclosure, the material of the organic insulating layer can also be as same as that of the photoresist used in forming the first via hole. For example, the material of the organic insulating layer and the material of the photoresist used in forming the first via hole both are a material of negative photoresist or a positive photoresist. In such case, the second mask used in forming the first via hole and the first mask used in forming the second via hole can be the same one, so as to reduce the cost of manufacturing the via holes, and hence to reduce the cost of manufacturing the display substrate.

In the embodiment of the present disclosure, an amount of light exposure utilized in exposing the organic insulating layer 8 can be as same as that utilized in exposing the photoresist 12. In such case, because the material of the organic insulating layer 8 adopts the material of the photoresist 12, additional etching the organic insulating layer 8 is not needed when forming the second via hole. Therefore, it can ensure that an aperture of a portion of the second via hole corresponding to the first via hole is smaller than an aperture of the first via hole.

For example, the amount of light exposure utilized in exposing the organic insulating layer can be different from that utilized in exposing the photoresist. For example, the amount of light exposure utilized in exposing the organic insulating layer 8 can be smaller than that utilized in exposing the photoresist 12, for example, the amount of light exposure utilized in exposing the organic insulating layer 8 is 80%~90% of that utilized in exposing the photoresist 12, so as to further ensure that the aperture of the portion of the second via hole corresponding to the first via hole is smaller than the aperture of the first via hole.

Figure 12:
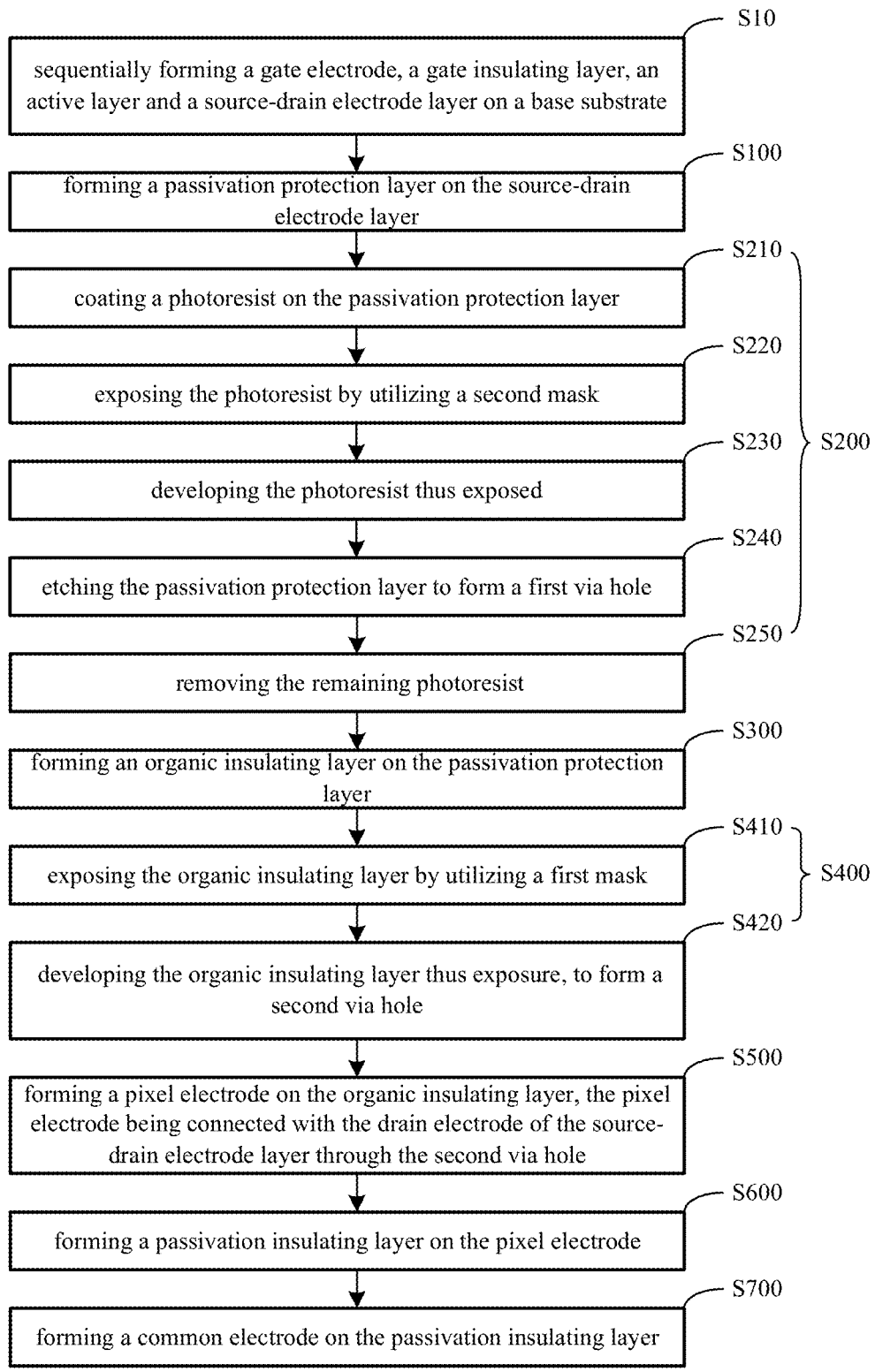
FIG. 12 is a flow chart illustrating a manufacturing method of a display substrate provided by an embodiment of the present disclosure.

Referring to FIG. 12, an embodiment of the present disclosure further provides a manufacturing method of a display substrate, which includes the manufacturing method of the via hole as provided by the embodiments above.

The manufacturing method of the display substrate possesses the same advantages as that of the manufacturing method of the via hole without repeating herein.

Still referring to FIG. 12, before forming the via hole, that is, before the step S100 of forming a passivation protection layer on a source-drain electrode layer, the manufacturing method of a display substrate further includes:

Step S10, sequentially forming a gate electrode, a gate insulating layer, an active layer and the source-drain electrode layer on a base substrate.

Still referring to FIG. 12, after forming the via hole, that is, after the step S400 of forming a second via hole in a portion of the organic insulating layer corresponding to the first via hole, the manufacturing method of a display substrate further includes:

Step S500, forming a pixel electrode on the organic insulating layer, the pixel electrode connecting with the drain electrode of the source-drain electrode layer through the second via hole.

Still referring to FIG. 12, after the step S500 of forming a pixel electrode on the organic insulating layer, the manufacturing method of a display substrate further includes:

Step S600, forming a passivation insulating layer on the pixel electrode; and

Step S700, forming a common electrode on the passivation insulating layer.

Figure 13:
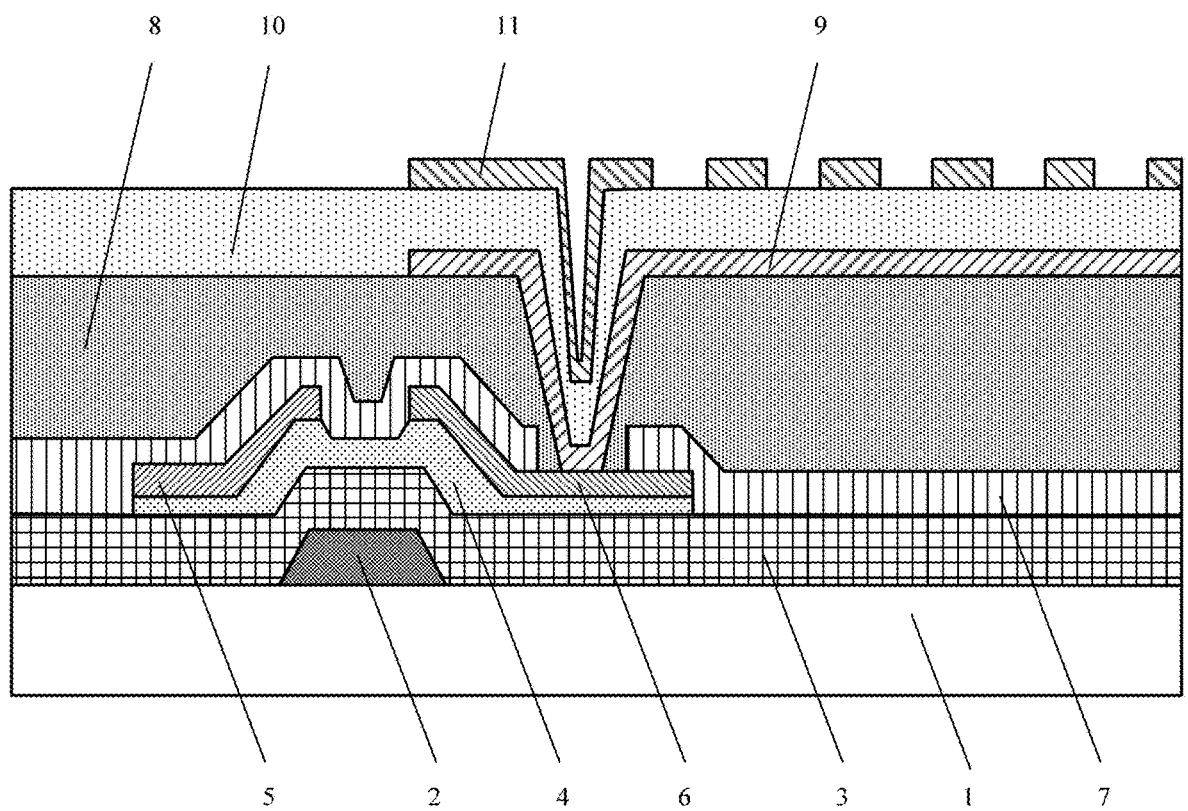
FIG. 13 is a structural view of a display substrate provided by an embodiment of the present disclosure.

For example, referring to FIG. 13, the display substrate includes a base substrate 1, and a thin film transistor (TFT), a passivation protection layer 7, an organic insulating layer 8, a pixel electrode 9, a passivation insulating layer 10 and a common electrode 11 which are sequentially located on the base substrate 1; the TFT includes a gate electrode 2, a gate insulating layer 3, an active layer 4 and a source-drain electrode layer which are sequentially located on the base substrate 1; a material of the active layer 4 can be monocrystalline silicon, polysilicon or metallic oxide; the source-drain electrode layer includes a source electrode 5 and a drain electrode 6. The pixel electrode 9, for example, is in direct contact with a second side wall of the organic insulating layer 8 but has no contact with the passivation protection layer 7.

Steps of manufacturing the above display substrate can include: first of all, forming a TFT on a base substrate, that is, performing the step S10, for example, forming a gate electrode on the base substrate firstly, and then covering the base substrate and the gate electrode with a gate insulating layer, and then forming an active layer on the gate insulating layer, and then forming a source-drain electrode layer including a source electrode and a drain electrode on the active layer; subsequently, forming a passivation protection layer on the source-drain electrode layer of the TFT, that is, performing the step S100; subsequently, forming a first via hole in a portion of the passivation protection layer corresponding to the drain electrode of the source-drain electrode layer, that is, performing the step S200; subsequently, forming an organic insulating layer on the passivation protection layer, that is, performing the step S300; subsequently, forming a second via hole in a portion of the organic insulating layer corresponding to the first via hole, the second via hole exposing the drain electrode and an aperture of a portion of the second via hole corresponding to the first via hole is smaller than an aperture of the first via hole, that is, performing the step S400; subsequently, forming a pixel electrode on the organic insulating layer, the pixel electrode being connected with the drain electrode of the source-drain electrode layer through the second via hole, that is, performing the step S500; subsequently, forming a passivation insulating layer on the pixel electrode, that is, performing the step S600; and subsequently, forming a common electrode on the passivation insulating layer, that is, performing the step S700.

Referring to FIG. 13, an embodiment of the present disclosure further provides a display substrate, including a base substrate 1, and a source-drain electrode layer, a passivation protection layer 7, an organic insulating layer 8 and a pixel electrode 9 located above the base substrate 1; the source-drain electrode layer includes a drain electrode 6; a portion of the passivation protection layer 7 corresponding to the drain electrode 6 is provided with a first via hole; the organic insulating layer 8 covers the passivation protection layer 7 and is filled in the first via hole; a portion of the organic insulating layer 8 corresponding to the first via hole is provided with a second via hole, the second via hole exposes the drain electrode 6, and an aperture of a portion of the second via hole corresponding to the first via hole is smaller than an aperture of the first via hole; the pixel electrode 9 is connected to the drain electrode 6 through the second via hole.

The display substrate possesses the same advantages as that of the manufacturing method of a display substrate described above, without repeating herein.

Still referring to FIG. 13, the display substrate provided by the embodiment of the present disclosure further includes: a gate electrode 2, a gate insulating layer 3 and an active layer 4 which are located between the base substrate 1 and the source-drain electrode layer and are sequentially stacked; and a passivation insulating layer 10 and a common electrode 11 which are located on the pixel electrode 9 and are sequentially stacked. The gate electrode 2, the gate insulating layer 3, the active layer 4 and the source-drain electrode layer constitute the TFT; and the source-drain electrode layer includes a source electrode 5 and a drain electrode 6 of the TFT.

In the description of the above implementations, particular feature(s), structure(s), material(s) or characteristic(s) may be combined, in any appropriate way, in any one or more embodiments or examples.

The above are merely specific implementations of the present disclosure without limiting the protection scope of the present disclosure thereto. Without departing from the technical scope revealed in the present disclosure, modification(s) or substitution(s) may be easily conceivable for those skilled in the art. Therefore the protection scope of the present disclosure should be based on the protection scope of the appended claims.

What is claimed is:

1. A manufacturing method of a via hole, comprising:
   forming a passivation protection layer on a conductive layer;
   forming a first via hole penetrating the passivation protection layer, the first via hole being defined by a first side wall of the passivation protection layer;
   forming an organic insulating layer on the passivation protection layer; and
   forming a second via hole penetrating the organic insulating layer, the second via hole being defined by a second side wall of the organic insulating layer, wherein
   in a sectional view, a bottom of the second via hole is located in the first via hole and is in direct contact with the conductive layer, and the second side wall of the organic insulating layer is separated from the first side wall of the passivation protection layer, wherein a material of the organic insulating layer is a photoresist material,
   wherein forming the second via hole penetrating the organic insulating layer comprises: exposing the organic insulating layer by utilizing a first mask; and developing the organic insulating layer thus exposed, to form the second via hole,
   the forming the first via hole penetrating the passivation protection layer comprises: coating a photoresist on the passivation protection layer; exposing the photoresist by utilizing a second mask; developing the photoresist thus exposed; etching the passivation protection layer to form the first via hole; and removing the remaining photoresist,
   the first mask and the second mask are a same one mask, an amount of light exposure utilized in exposing the organic insulating layer is 80%~90% of an amount of light exposure utilized in exposing the photoresist, and a material of the organic insulating layer is the same as that of the photoresist.

2. The manufacturing method of the via hole according to claim 1, wherein the conductive layer is a drain electrode of a thin film transistor of a display substrate.

3. A manufacturing method of a display substrate, comprising the manufacturing method of the via hole according to claim 1.

4. The manufacturing method of the display substrate according to claim 3, wherein the conductive layer is a source-drain electrode layer,
   before forming the passivation protection layer on the conductive layer, the manufacturing method of the display substrate further comprises:

sequentially forming a gate electrode, a gate insulating layer, an active layer, and the source-drain electrode layer on a base substrate, after forming the second via hole penetrating the organic insulating layer, the manufacturing method of the display substrate further comprises:

forming a pixel electrode on the organic insulating layer, the pixel electrode being connected to a drain electrode of the source-drain electrode layer through the second via hole;

forming a passivation insulating layer on the pixel electrode; and forming a common electrode on the passivation insulating layer.

* * * * *